United States Patent
Pickles et al.

(10) Patent No.: US 11,384,426 B2
(45) Date of Patent: Jul. 12, 2022

(54) METHOD FOR MAKING DIAMOND LAYERS BY CVD

(71) Applicant: Element Six Technologies Limited, Oxfordshire (GB)

(72) Inventors: Charles Simon James Pickles, Oxfordshire (GB); Christopher Wort, Oxfordshire (GB); John Brandon, Oxfordshire (GB); Neil Perkins, Oxfordshire (GB)

(73) Assignee: Element Six Technologies Limited, Didcot (GB)

( * ) Notice: Subject to any disclaimer, the term of this patent is extended or adjusted under 35 U.S.C. 154(b) by 0 days.

(21) Appl. No.: 14/646,293

(22) PCT Filed: Dec. 4, 2013

(86) PCT No.: PCT/EP2013/075576
§ 371 (c)(1),
(2) Date: May 20, 2015

(87) PCT Pub. No.: WO2014/090664
PCT Pub. Date: Jun. 19, 2014

(65) Prior Publication Data
US 2015/0315700 A1    Nov. 5, 2015

Related U.S. Application Data (60) Provisional application No. 61/736,423, filed on Dec. 12, 2012.

(30) Foreign Application Priority Data

Dec. 12, 2012   (GB) ..................................... 1222395

(51) Int. Cl.
C23C 16/27   (2006.01)
C23C 16/01   (2006.01)
H01J 37/32   (2006.01)

(52) U.S. Cl.
CPC ............ *C23C 16/01* (2013.01); *C23C 16/274* (2013.01); *C23C 16/276* (2013.01);
(Continued)

(58) Field of Classification Search
None
See application file for complete search history.

(56) References Cited

U.S. PATENT DOCUMENTS

| 6,022,622 A | 2/2000 | Domoto et al. |
| 6,035,803 A * | 3/2000 | Robles ................... C23C 16/26 |
| | | 118/723 E |

(Continued)

FOREIGN PATENT DOCUMENTS

| EP | 0528778 A1 | 2/1993 |
| GB | 2224753 A | 5/1990 |

(Continued)

OTHER PUBLICATIONS

Yokota, Y., JP 2004244298 A, Machine Translation, Originally Published 2004, p. 1-27.*

(Continued)

*Primary Examiner* — David P Turocy
(74) *Attorney, Agent, or Firm* — Kilpatrick Townsend & Stockton LLP (57) ABSTRACT

A method of coating a non-refractory and/or non-planar substrate (8) with synthetic diamond material using a microwave plasma chemical vapour deposition (CVD) synthesis technique, the method comprising: forming a composite substrate assembly (1) comprising: a support substrate (2) comprising an upper surface; one or more electrically conductive refractory guards (6) disposed over the upper surface of the support substrate and extending to a height $h_g$ above the upper surface of the support substrate; and one or more non-refractory and/or non-planar substrates disposed over the upper surface of the support substrate and extending to a height $h_s$ above the upper surface of the support substrate, wherein the height $h_s$ is less than the height $h_g$, wherein a (Continued)

difference in height $h_g$–$h_s$ lies in a range 0.2 mm to 10 mm; placing the composite substrate assembly within a plasma chamber of a microwave plasma CVD reactor; feeding process gases into the plasma chamber including a carbon containing gas and a hydrogen containing gas; feeding microwaves in the plasma chamber to form a microwave plasma at a location over the composite substrate assembly; and growing synthetic diamond material on the one or more non-refractory and/or non-planar substrates.

11 Claims, 6 Drawing Sheets (52) U.S. Cl.
CPC .. *H01J 37/32192* (2013.01); *H01J 37/32403* (2013.01); *H01J 37/32642* (2013.01)

(56) References Cited

U.S. PATENT DOCUMENTS

| | | | |
|---|---|---|---|
| 6,248,400 B1 * | 6/2001 | Kurihara | C23C 16/01 423/446 |
| 6,508,911 B1 | 1/2003 | Han et al. | |
| 7,037,370 B2 * | 5/2006 | Mearini | C30B 25/105 117/68 |
| 2005/0025973 A1 | 2/2005 | Slutz et al. | |

FOREIGN PATENT DOCUMENTS

| | | | | |
|---|---|---|---|---|
| GB | 2486783 A | * | 6/2012 | ........... C23C 16/274 |
| JP | 59055700 A | * | 3/1984 | ............. H04R 9/046 |
| JP | H04211598 A | | 8/1992 | |
| JP | 2004244298 A | * | 9/2004 | |
| JP | 2004244298 A | * | 9/2004 | |
| SE | 0528778 A1 | * | 2/1993 | ........... C23C 16/274 |

OTHER PUBLICATIONS

Sato, K., JP 5905570 A, Machine Translation, orignially published 1984, p. 1-4.*
Machine Translation of JP-2004244298-A, retrieved 2019.*
UKIPO Search Report for GB1222395.4 dated Jul. 11, 2013
UKIPO Search Report for GB1321391.3 dated Jan. 21, 2014.
International Search Report for PCT/EP2013/075576 dated Jan. 17, 2014.
Japanese Patent Application No. 2015-546949, Office Action dated Jun. 27, 2016, 5 pages.

* cited by examiner

METHOD FOR MAKING DIAMOND LAYERS BY CVD

FIELD OF INVENTION

Certain embodiments of the present invention relate to a method of conformally coating non-planar and/or non-refractory substrates with synthetic diamond material using a microwave plasma chemical vapour deposition (CVD) synthesis technique. Certain further embodiments of the present invention relate to non-planar and/or non-refractory polycrystalline CVD synthetic diamond components including non-planar and/or non-refractory components conformally coated with high quality polycrystalline CVD synthetic diamond material.

BACKGROUND OF INVENTION

Synthetic CVD diamond films can be grown using a variety of methods including hot filament, microwave plasma, and DC arc jet reactors. Each of these methods has its virtues. DC arc jet deposition systems tend to have high localized growth rates, but suffer from electrode/nozzle erosion, high gas consumption, and relatively poor area coverage. Hot filament reactors can coat large areas and three dimensional shapes but with limited film thickness and with relatively poor quality diamond material. In contrast, microwave plasma CVD synthetic diamond has become established as the leading method for producing high quality, bulk diamond material in the form of planar free-standing polycrystalline wafers. Unfortunately, microwave plasma methods have only limited capabilities to coat non-planar substrates due to adverse interactions between the microwave electric field and the non-planar substrates or workpieces being coated. Coating of even simple three dimensional shapes such as tool inserts or loudspeaker dome mandrels is made difficult by the effects of electric field concentrations at external corners or conversely the weakness in electric fields at internal corners. This variation in the electric field adversely affects uniformity of both quality and thickness of the diamond film. For example, to date microwave plasma CVD reactors has not been successfully be used to conformally coat cutting tool inserts. At the corners of such cutting tool inserts high electric fields lead to thickening and rounding of the critical cutting edges, thus making them unsuitable for their intended purpose.

Non-refractory materials such as silicon that are thermally sensitive in terms of melting point or thermal shock are also challenging to coat uniformly in a microwave plasma reactor as the microwave plasma tends to damage the non-refractory substrate material.

In light of the above, what is needed is a method to conformally coat non-refractory substrates and/or three-dimensional (i.e. non-planar) shapes, such as cutting tool inserts and loudspeaker dome mandrels, using a microwave plasma CVD diamond synthesis technique which will result in high quality polycrystalline CVD diamond material uniformly coated over the surface of the substrate material without undue rounding and thickening at edges and corners and/or without unduly damaging the substrate material.

It is an aim of certain embodiments of the present invention to solve the aforementioned problems.

SUMMARY OF INVENTION

According to a first aspect of the present invention there is provided a method of coating a non-refractory and/or non-planar substrate with synthetic diamond material using a microwave plasma chemical vapour deposition (CVD) synthesis technique, the method comprising:
   forming a composite substrate assembly comprising:
      a support substrate comprising an upper surface; one or more electrically conductive refractory guards disposed over the upper surface of the support substrate and extending to a height $h_g$ above the upper surface of the support substrate; and
      one or more non-refractory and/or non-planar substrates disposed over the upper surface of the support substrate and extending to a height $h_s$ above the upper surface of the support substrate, wherein the height $h_s$ is less than the height $h_g$, wherein a difference in height $h_g - h_s$ lies in a range 0.2 mm to 10 mm;
   placing the composite substrate assembly within a plasma chamber of a microwave plasma CVD reactor;
   feeding process gases into the plasma chamber including a carbon containing gas and a hydrogen containing gas;
   feeding microwaves in the plasma chamber to form a microwave plasma at a location over the composite substrate assembly; and
   growing synthetic diamond material on the one or more non-refractory and/or non-planar substrates.

According to a second aspect of the present invention there is provided a composite component comprising:
   a non-planar base;
   and a polycrystalline CVD synthetic diamond coating on a surface of the non-planar base,
   wherein the non-planar base has a longest linear dimension when projected onto a plane of no less than 5 mm,
   wherein the polycrystalline CVD synthetic diamond coating has a thickness in a range 5 to 100 µm,
   wherein the thickness of the polycrystalline CVD synthetic diamond coating varies by no more than 75% of an average thickness of the polycrystalline CVD synthetic diamond coating, excluding any tapering at the peripheral edge of the polycrystalline CVD synthetic diamond coating,
   wherein the polycrystalline CVD synthetic diamond coating comprises micron scale inter-grown diamond grains and a low sp2 carbon content indicative of a microwave plasma CVD synthesis technique, and
   wherein the polycrystalline CVD synthetic diamond coating has no cracks which extend greater than 2 mm in length.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Embodiments of the present invention utilize a CVD synthetic diamond synthesis method described herein as "indirect plasma growth" for coating three dimensional/non-planar substrates and/or non-refractory substrates such as silicon. The method uses electrically conductive refractory guards which extend into a region between the microwave plasma and the substrates which are to be coated with diamond material. The electrically conductive refractory guards provide a defined focal point for the microwave electric field such that a plasma of suitable intensity may be sustained in a stable manner above a region in which one or more substrates may be placed. The substrates are positioned just below the surface of the electrically conductive refractory guards such that the electric field at the surface of the substrates is below that required to cause localized breakdown at, for example, sharp external corners. In this way, the substrates can be considered to be shielded from the microwave plasma rather than being directly exposed, hence the term "indirect plasma growth". However, it will be noted that the substrates are still physical exposed to the microwave cavity for achieving diamond growth thereon. The shielding is of an electrical nature and is provided by the electrically conductive refractory guards which can be configured to be located around a periphery of one or more substrates to be coated. For example, the electrically conductive refractory guards can be in the form of a ring or a series of concentric rings centred on the central rotational axis of the plasma chamber. Alternatively, the electrically conductive refractory guards may be in the form of a plurality of posts or projections extending upwards from a support substrate around a peripheral region of the substrates to be coated and extending above an upper surface of the substrates to be coated.

Figure 1:
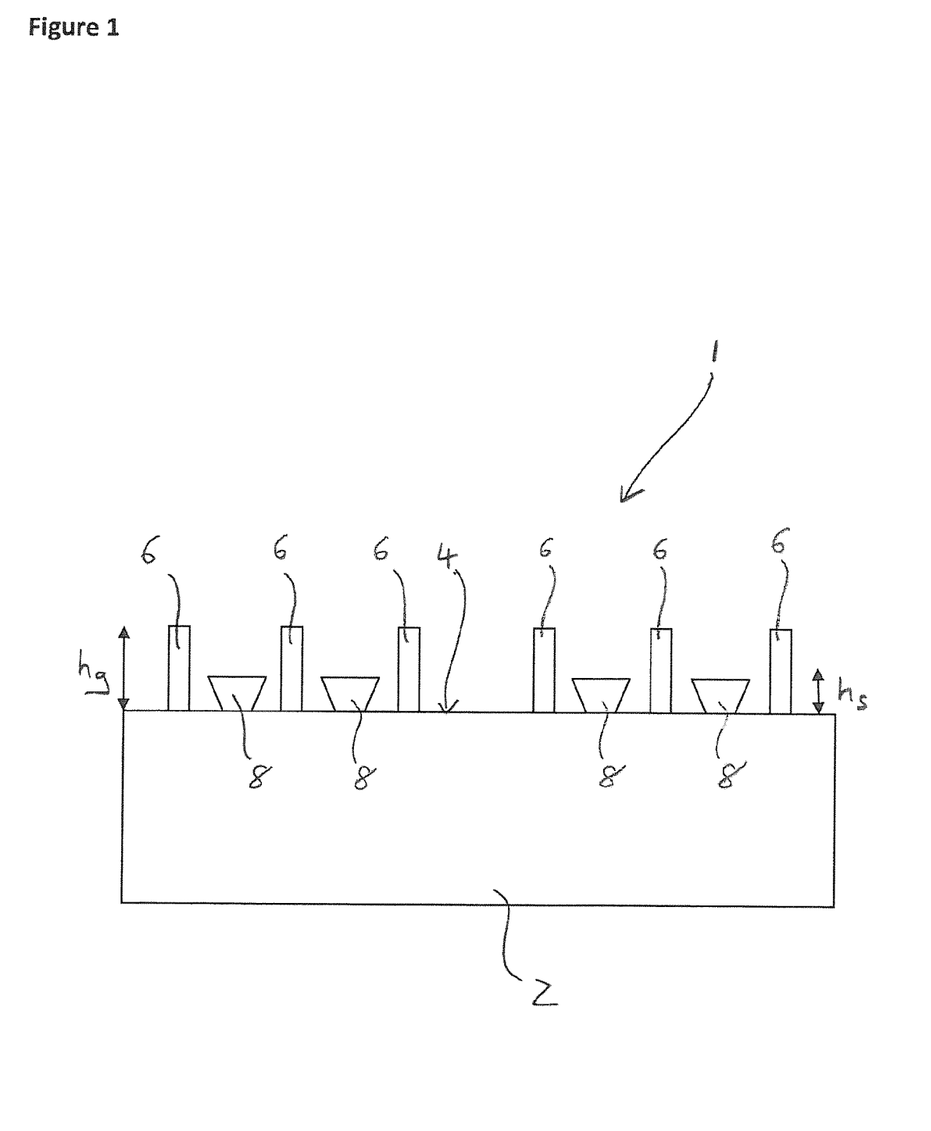
FIG. 1 illustrates a cross-sectional view of a composite substrate assembly for use in the present invention.
Figure 2:
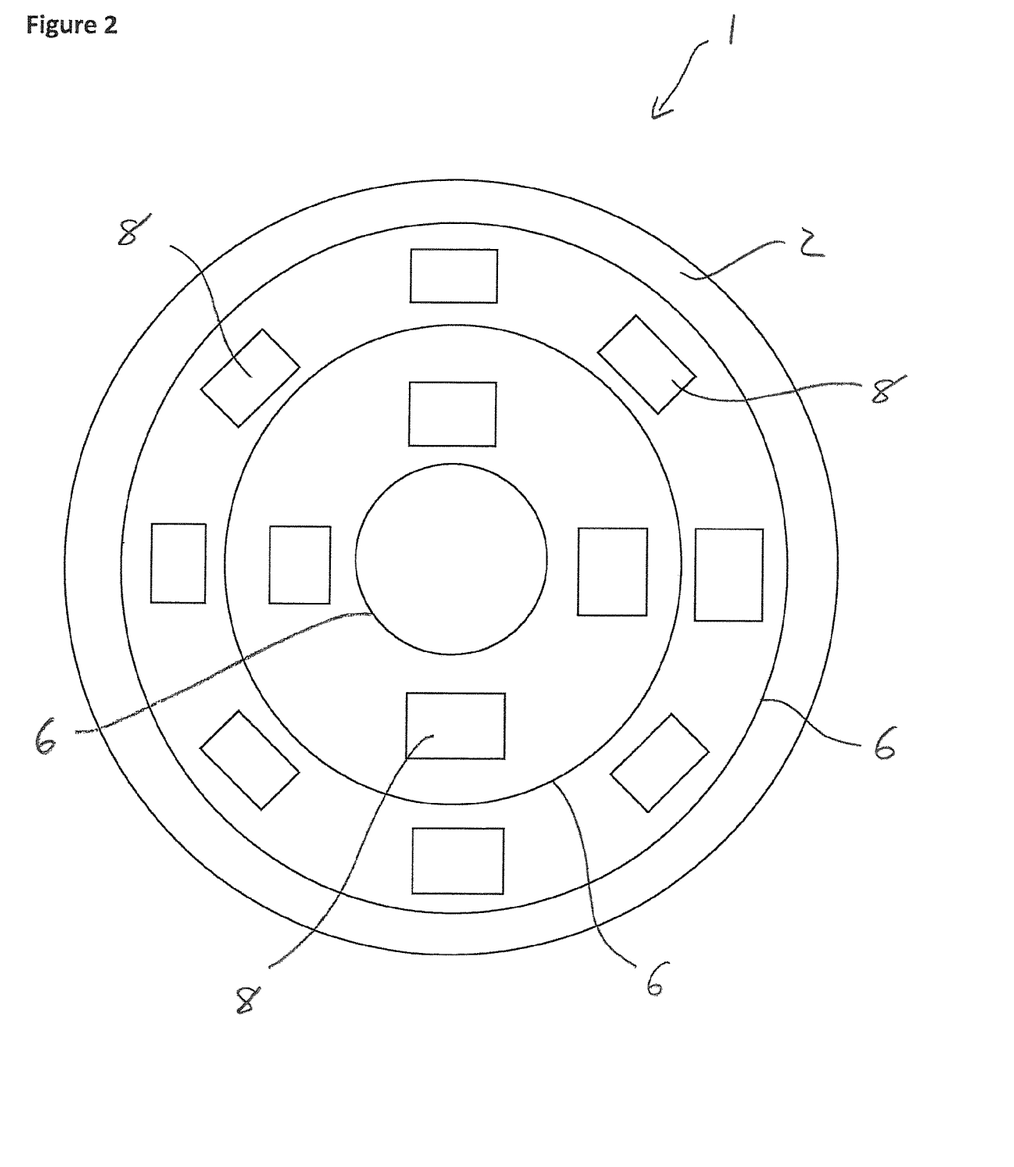
FIG. 2 illustrates a top-view of the composite substrate assembly shown in FIG. 1.

The indirect plasma growth method of embodiments of the present invention involves the formation of a composite substrate assembly, an example of which is illustrated in FIGS. 1 and 2, FIG. 1 showing a cross-sectional view and FIG. 2 showing a top view. The composite substrate assembly 1 includes: a support substrate 2 comprising an upper surface 4; a plurality of electrically conductive refractory guard rings 6 disposed over the upper surface 4 of the support substrate 2 and extending to a height $h_g$ above the upper surface 4 of the support substrate 2; and a plurality of non-planar substrates 8 disposed over the upper surface 4 of the support substrate 2 and extending to a height $h_s$ above the upper surface 4 of the support substrate 2, wherein the height $h_s$ is less than the height $h_g$. The illustrated embodiments comprises three electrically conductive refractory guard rings 6 which are arranged concentrically and centred on the central rotational axis of the support substrate 2. The non-planar substrates comprise a plurality of metallic cutting inserts 8 disposed in the annular regions defined by the electrically conductive refractory guard rings 6.

Figure 3:
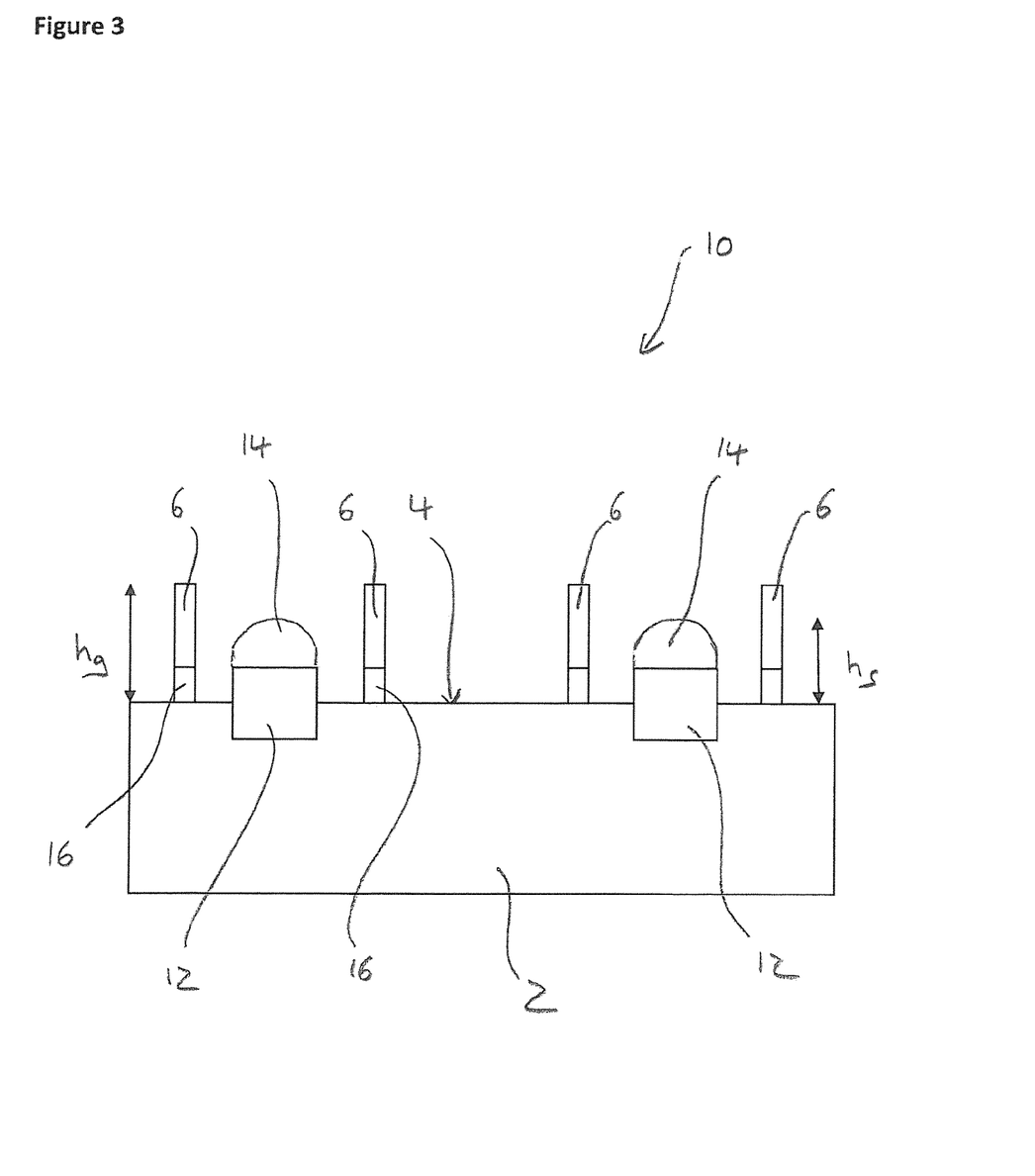
FIG. 3 illustrates a cross-sectional view of a composite substrate assembly according to another embodiment of the present invention.
Figure 4:
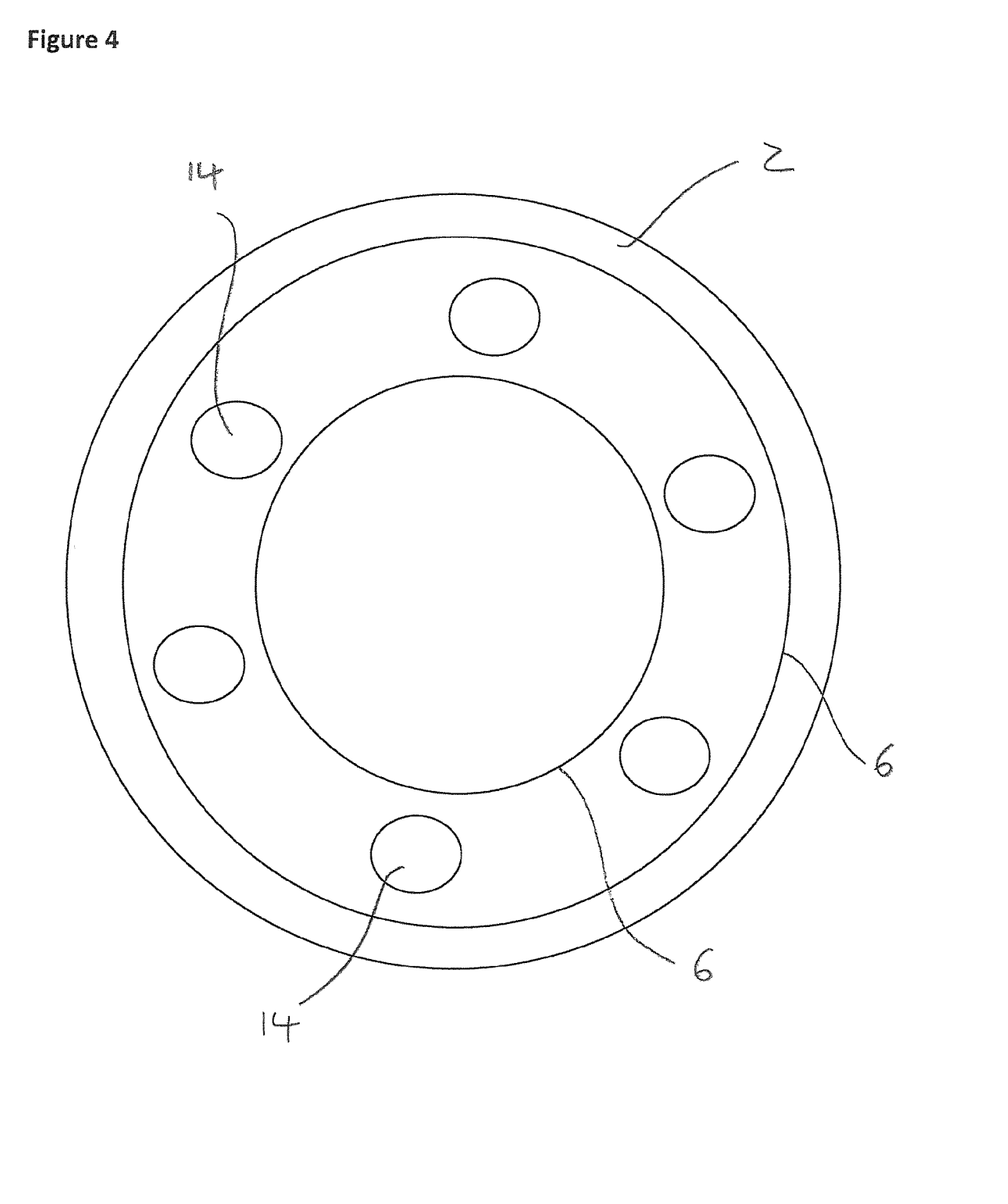
FIG. 4 illustrates a top-view of the composite substrate assembly shown in FIG. 3.

FIGS. 3 and 4 illustrate a cross-sectional view and a top view of an alternative embodiment of a composite substrate assembly which is suitable for fabricating curved diamond diaphragms or domes. Such domes may be used for a variety of applications, including applications involving static or dynamic pressure differentials. For example, where a largely static pressure differential is required, but the material needs to be transparent to electromagnetic radiation, then curved diamond diaphrams may be appropriate, the curvature providing additional rigidity for the thin layer. In the case of dynamic applications, such as acoustic pickups or acoustic drivers, the curvature provides for a rigid dome which is also very light and able to respond at high frequencies without interference from resonant modes in the structure. As with the previously discussed arrangement, the composite substrate assembly 10 comprises a support substrate 2 having an upper surface 4. A plurality of non-planar substrates 14 in the form of silicon dome mandrels are disposed over the upper surface 4 of the support substrate 2. In the illustrated arrangement the dome mandrels 14 are supported on pedestals 12 which are mounted on the support substrate 2. The illustrated embodiment comprises two electrically conductive refractory guard rings 6 which are supported on support posts 16 and arranged concentrically, centred on the central rotational axis of the support substrate 2. The dome mandrels are disposed in the annular region defined by the electrically conductive refractory guard rings 6.

A difference in height $h_g-h_s$ between a top surface of the electrically conductive refractory guards and a top surface of the non-planar substrates is in a range 0.2 mm to 10 mm, optionally less than 7 mm, 5 mm, 4 mm, or 3 mm, and optionally more than 0.3 mm, 0.5 mm, 1 mm, 1.5 mm, or 2 mm. For example, the difference in height $h_g-h_s$ may lie in a range 0.3 mm to 10 mm, 0.5 mm to 7 mm, 1 mm to 5 mm, 1 mm to 4 mm, or 2 mm to 3 mm. The electrically conductive refractory guards should be located sufficient above the non-planar substrates to protect the non-planar substrates from a plasma located over the composite substrate assembly in use but not too high that deposition of diamond material on the non-planar substrates is adversely affected by the plasma being pushed too far from the non-planar substrates. In principle, the difference in height $h_g-h_s$ may be kept as small as is practical to keep the non-planar substrate close to the plasma thereby increasing growth rates on the non-planar substrate while at the same time protecting the non-planar substrate from the plasma.

The one or more electrically conductive refractory guards may be in the form of continuous or discontinuous rings, most preferably continuous rings. As shown in the previously discussed embodiments, the composite substrate assembly may comprise at least two electrically conductive refractory guards, and these may be configured to be rotationally symmetric or substantially rotationally symmetric, for example ignoring short discontinuities in the ring, and centred on a central rotational axis of the plasma chamber. The entire composite substrate assembly may be configured to be rotationally symmetric and centred on a central rotational axis of the plasma chamber. Such arrangements maintain the symmetry of the plasma chamber and aid in forming a uniform plasma. In particular, it may be noted that the substrate structure affects the electric field profile above the substrate and thus a symmetric substrate structure is desirable to retain a symmetric electric field profile and achieve uniform diamond deposition over the non-planar substrates.

Alternatively, rather than using ring structures the electrically conductive refractory guards may comprise a plurality of posts or projections extending upwards from the support substrate and distributed around the non-planar substrates to protect the non-planar substrates from the plasma during diamond growth thereon. The posts may be distributed in a rotationally symmetric fashion for the reasons given above. It is considered that such a refractory guard structure would not interact badly with the electric field profile above the substrate.

The one or more electrically conductive refractory guards may be formed of any electrically conductive metal material which is capable of withstanding the harsh thermal and chemical environment under a microwave plasma. Examples include tantalum, molybdenum, tungsten, or graphite.

The one or more non-planar substrates may be formed of a non-metallic material such as silicon or silicon carbide, e.g. for dome mandrels. In this case, the one or more non-planar substrates may be removed from the synthetic diamond material after growth to yield one or more free-standing non-planar polycrystalline CVD synthetic diamond components.

Alternatively, the one or more non-planar substrates may be formed of a metallic material, or the carbide of a metal such as WC, with the synthetic diamond material forming a permanent coating adhered to the metallic or carbide material, e.g. a metallic or carbide tool or wear part coated with polycrystalline CVD synthetic diamond material.

Figure 5:
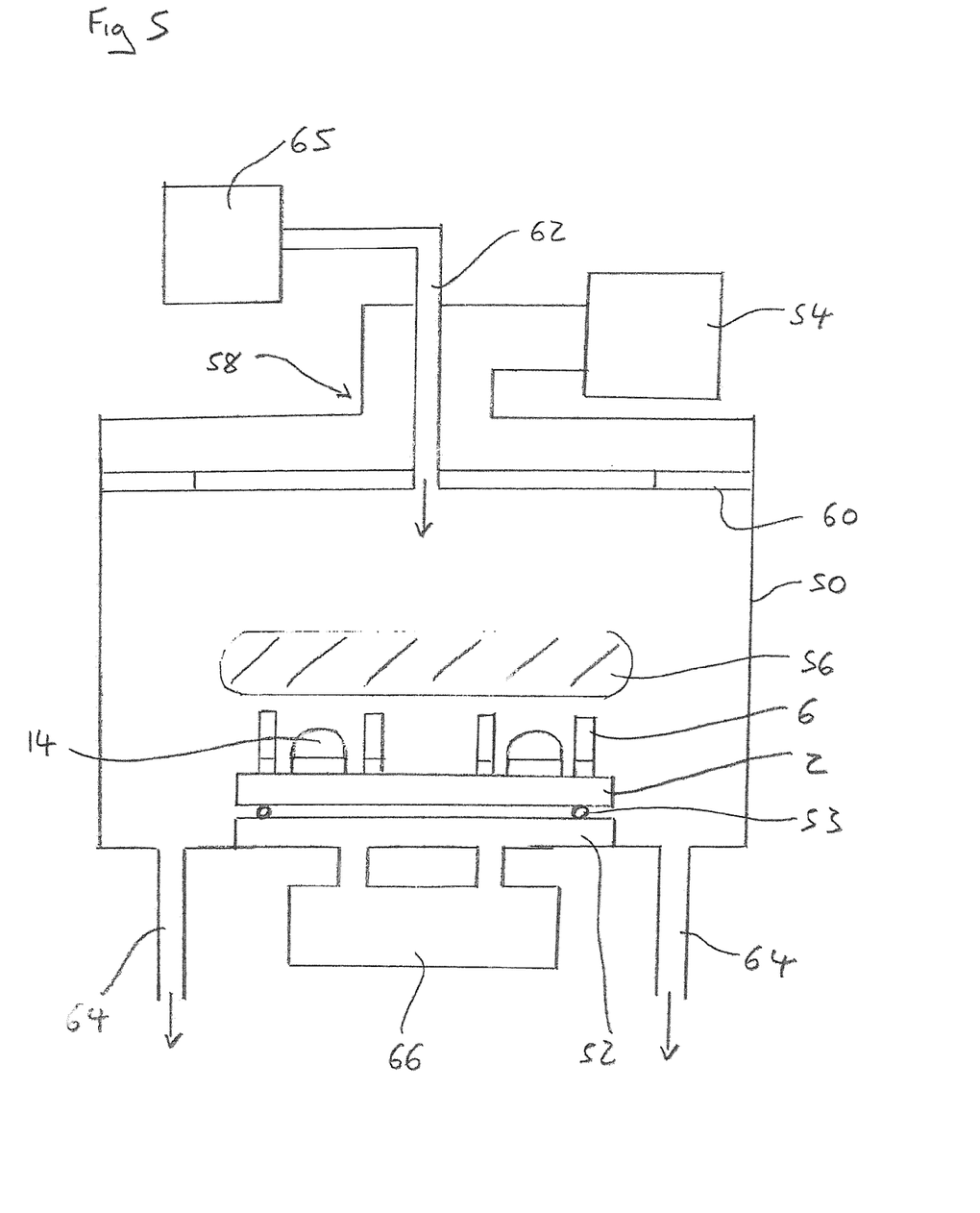
FIG. 5 illustrates a microwave plasma CVD reactor comprising a composite substrate assembly as illustrated in FIGS. 3 and 4.

FIG. 5 illustrates a microwave plasma CVD reactor comprising a composite substrate assembly as illustrated in FIGS. 3 and 4. The microwave plasma reactor comprises the following basic components: a plasma chamber 50; a substrate holder 52 disposed in the plasma chamber for supporting the composite substrate assembly as previous discussed (in the illustrated example this is done via spacer wires 53); a microwave generator 54 for forming a plasma 56 within the plasma chamber 50; a microwave coupling configuration 58 for feeding microwaves from the microwave generator 54 into the plasma chamber 50 via dielectric windows 60; a gas flow system comprising one or more gas inlets 62 and one or more gas outlets 64 for feeding process gases into the plasma chamber 50 from a gas source 65 and removing them therefrom; and a substrate cooling system 66.

The composite substrate assembly illustrated in FIG. 5 is the same as that illustrated in FIGS. 3 and 4 and like reference numerals have been used.

The plasma chamber is configured to form a resonance cavity supporting a standing microwave in use. According to one configuration the plasma chamber is configured to support a $TM_{01n}$ standing microwave in use, e.g. a $TM_{011}$ mode. The operational frequency may be in a range 400 to 500 MHz, 800 to 1000 MHz, or 2300 to 2600 MHz. Source gases including a carbon source and molecular hydrogen are fed into the plasma reactor vessel and can be activated by the standing microwave to form a plasma in high electric field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

In use, the composite substrate assembly is placed within the plasma chamber as illustrated, process gases are fed into the plasma chamber including a carbon containing gas and a hydrogen containing gas, microwaves are fed into the plasma chamber to form a microwave plasma at a location over the composite substrate assembly; and synthetic diamond material is grown on the non-planar substrates 14. As previously discussed, the electrically conductive refractory guard rings 6 provide a defined focal point for the microwave electric field such that a plasma of suitable intensity may be sustained in a stable manner above a region in which one or more non-planar substrates are placed. The non-planar substrates are positioned just below the surface of the refractory metal conductors such that the electric field at the surface of the work-pieces is below that required to cause localized breakdown.

In addition to the above, it may also be noted that the operating temperature of the electrically conductive refractory guards during diamond growth affects plasma focussing. A high guard temperature causes the plasma to lock onto the guard structures and as the temperature of the guard structures increases to greater than 1500 K, radiative losses help to make the temperature more uniform and that in turn aids the plasma to distribute more uniformly over the composite substrate assembly. As such, preferably during diamond growth the composite substrate assembly is configured within the plasma chamber and the growth conditions (e.g. microwave power, gas pressure, and/or substrate temperature) are controlled such that the temperature of the guard structures is greater than 1500 K, 1700 K, 1900 K, or 2000 K.

Utilizing the methodology as outlined above, it is possible to fabricate a composite component comprising:
  a non-planar base;
  and a polycrystalline CVD synthetic diamond coating on a surface of the non-planar base,
  wherein the non-planar base has a longest linear dimension when projected onto a plane of no less than 5 mm,
  wherein the polycrystalline CVD synthetic diamond coating has a thickness in a range 5 to 100 µm,
  wherein the thickness of the polycrystalline CVD synthetic diamond coating varies by no more than 75% of an average thickness of the polycrystalline CVD synthetic diamond coating, excluding any tapering at a peripheral edge of the polycrystalline CVD synthetic diamond coating,
  wherein the polycrystalline CVD synthetic diamond coating comprises micron scale inter-grown diamond grains and a low sp2 carbon content indicative of a microwave plasma CVD synthesis technique over a majority area of the polycrystalline CVD synthetic diamond coating, excluding any tapering at the peripheral edge of the polycrystalline CVD synthetic diamond coating, where the majority area is at least 70%, 80%, 90%, 95%, 98% of a total area of the polycrystalline CVD synthetic diamond coating, and
  wherein the polycrystalline CVD synthetic diamond coating has no cracks which extend greater than 2 mm in length.

The sp2 carbon content can be measured using a suitably calibrated Raman spectroscopy technique. The polycrystalline CVD synthetic diamond coating comprises micron scale inter-grown diamond grains and an sp2 carbon content of no more than 0.1%, 0.01%, or 0.001% indicative of a microwave plasma CVD synthesis technique. That is, the microwave plasma CVD synthesis technique results in a high quality polycrystalline CVD synthetic diamond material when compared with other diamond synthesis techniques such as hot filament.

It has been found to be important to minimize the formation of sp2 carbon during growth of the polycrystalline CVD synthetic diamond coating as sp2 carbon can adversely affect mechanical characteristics such as wear resistance for tool applications and rigidity for acoustic applications. Raman spectroscopy has been found to be a particularly useful technique for measuring sp2 carbon content. Non-diamond carbon peaks include: 1580 cm$^{-1}$—graphite; 1350-

1580 cm$^{-1}$—nanocrysallite graphite; and 1550-1500 cm$^{1}$—amorphous carbon and graphitic phases. It has been found that if sp2 carbon is evident to any significant extent in a Raman spectrum of a synthetic diamond material then the material will have poorer mechanical characteristics. Accordingly, preferably the sp2 carbon content is sufficiently low as to not exhibit any significant non-diamond carbon peaks in a Raman spectrum of the material. The sp3 diamond Raman peak resides at approximately 1332 cm$^{-1}$. According to certain embodiments, using a helium-neon laser (633 nm) as the Raman excitation source produces a diamond Raman spectrum with an sp2 carbon peak at around 1550 cm$^{-1}$ which is no more than 20%, 10%, 5%, 1%, 0.1%, 0.01%, or 0.001% of the height of the sp3 diamond Raman peak residing at around 1332 cm$^{-1}$ after background subtraction. The amount of sp2 carbon may alternatively be assessed by measuring the height of the sp3 diamond Raman peak residing at approximately 1332 cm$^{-1}$ relative to the height of the local background to that peak which is due to impurities such as sp2 carbon. According to certain embodiments, using a Raman excitation source at 785 nm produces a diamond Raman spectrum with an sp3 carbon peak at approximately 1332 cm$^{-1}$ which is no less than 10%, 20%, 30%, 40%, 50%, 60%, or 70% of the local background intensity in the Raman spectrum.

Figure 6:
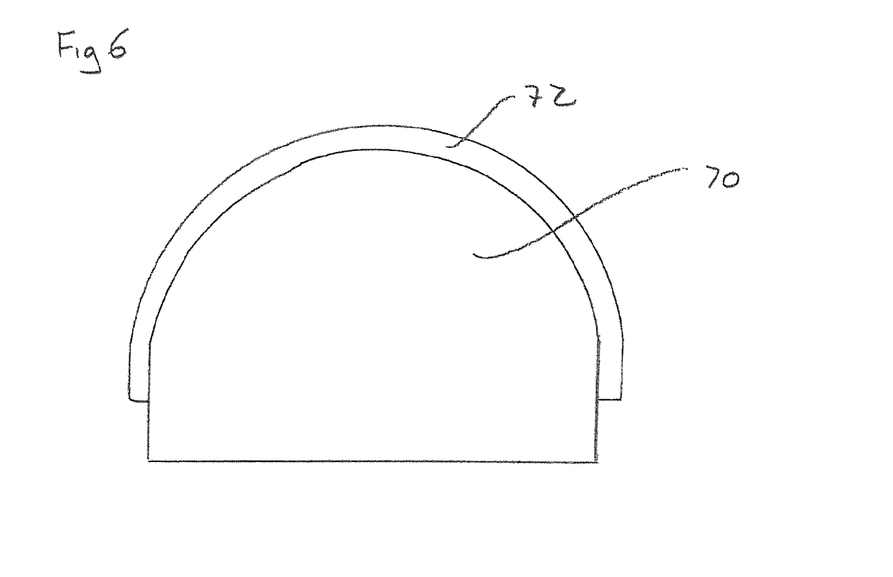
FIG. 6 illustrates a dome comprising a uniform layer of high quality polycrystalline CVD synthetic diamond material conformally coated thereon.

The non-planar base may comprise a convex dome with a peripheral skirt extending from an edge of the convex dome and the polycrystalline CVD synthetic diamond coating is disposed over the entire surface of the convex dome and extends down at least a portion of the peripheral skirt. For example, FIG. 6 illustrates a silicon dome mandrel 70 comprising a uniform layer of high quality polycrystalline CVD synthetic diamond material 72 conformally coated thereon. The silicon dome mandrel preferably comprises a convex dome with a substantially cylindrical skirt region extending downwards from the edge of the convex dome. The indirect plasma growth technique as described herein allows a uniform layer of high quality polycrystalline CVD synthetic diamond material to be coated both over the convex dome and down at least a portion of the substantially cylindrical skirt region, with the tapered edge of the diamond restricted to the substantially cylindrical skirt region, and preferably to no more than 50%, 40%, 30%, 20%, 10% of a length of the substantially cylindrical skirt region. The convex dome may have a diameter in a range 5 mm to 80 mm, 5 mm to 50 mm, 10 mm to 40 mm, 15 mm to 35 mm, or 20 mm to 30 mm. Furthermore, the convex dome has a radius of curvature in a range 10 mm to 120 mm, 10 mm to 80 mm, 20 mm to 70 mm, 30 mm to 60 mm, 40 mm to 55 mm, or 45 mm to 55 mm.

Figure 7:
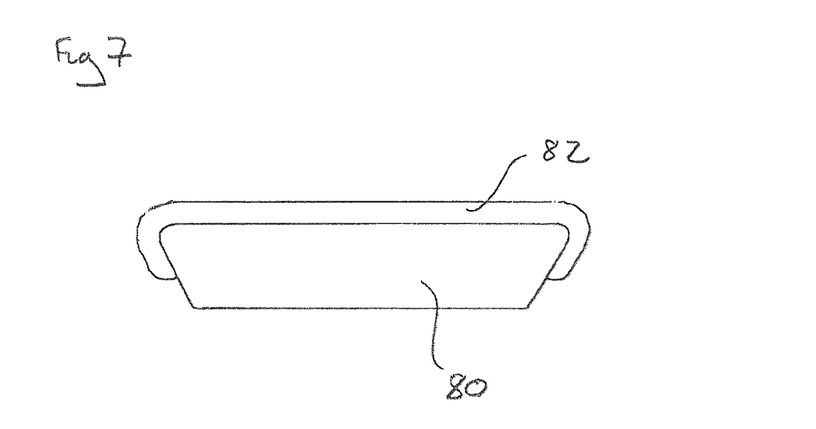
FIG. 7 illustrates a cutting tool insert comprising a uniform layer of high quality polycrystalline CVD synthetic diamond material conformally coated around cutting edges thereof.

Alternatively, the non-planar base may be a tool or wear part comprising at least two surfaces and an edge or corner disposed between said two surfaces, wherein the polycrystalline CVD synthetic diamond coating is disposed over at least a portion of the two surfaces and conformally coats said edge or corner. The edge or corner may have a radius of curvature no more than 5 mm, 3 mm, 1 mm, 0.5 mm, or 0.1 mm. For example, FIG. 7 illustrates a cutting tool insert 80 comprising a uniform layer of high quality polycrystalline CVD synthetic diamond material 82 conformally coated around cutting edges thereof. Again, the indirect plasma growth technique as described herein allows a uniform layer of high quality polycrystalline CVD synthetic diamond material to be coated both over the top surface of the cutting tool insert and down at least a portion of the side walls of the cutting tool insert with a conformal coating around cutting edges disposed between the top surface and side walls.

In the aforementioned dome and tool examples, the polycrystalline CVD diamond coating should be sufficiently thick to provide a complete and robust coating while not being too thick that functional characteristics or cost of fabrication will be compromised. The thickness of the polycrystalline CVD synthetic diamond coating may be no less than 7 µm, 10 µm, 20 µm, 30 µm, 50 µm, or 70 µm. According to certain preferred embodiments the thickness of the polycrystalline CVD synthetic diamond coating is in a range 10 to 70 µm, 20 to 60 µm, or 30 to 50 µm. Furthermore, the thickness of the polycrystalline CVD synthetic diamond coating may vary by no more than 60%, 50%, 40%, or 30% of an average thickness of the polycrystalline CVD synthetic diamond coating, excluding any tapering at the peripheral edge of the polycrystalline CVD synthetic diamond coating.

EXAMPLE 1

Coating of Cutting Tool Inserts

Three tantalum rings of 7 mm height, 1 mm width, and 130 mm, 70 mm and 20 mm diameter respectively were placed on a 140 mm×12 mm tungsten substrate carrier which itself was positioned on wire spacers over a support surface within a microwave plasma CVD reactor. A plurality of tungsten carbide/6% Co cutting tool inserts were placed on the surface of the tungsten substrate carrier between the tantalum rings such that an upper most point of the cutting tool inserts was located below an upper most surface of the tantalum rings. Inserts were coated for a period of 2 hrs at 180 torr process pressure in a $CH_4/H_2$ plasma. The resulting polycrystalline CVD synthetic diamond coating was uniform, of high quality, and conformal around the edges of the cutting inserts.

EXAMPLE 2

Fabrication of Free-Standing Diamond Curved Diaphrams and Domes

Six silicon mandrels having a diameter of 26.3 mm, a radius of curvature of 20 mm, and a height of 8 mm including a skirt region were equally spaced in a circular configuration on 6 mm tall pedestals of the same diameter mounted on a carrier substrate. As such, the silicon mandrels extended to a height of 14 mm above the carrier substrate. Two tantalum rings of 7 mm height, 1 mm width, and outer diameter 10 mm and 128 mm respectively were positioned on either side of the circular configuration of mandrels. The tantalum rings were positioned on support posts of height 9.6 mm such that the rings extended to a height of 16.6 mm above the carrier substrate. As such the tantalum rings extended 2.6 mm above the silicon mandrels.

The structure was positioned in the centre of the base of an 896 MHz microwave plasma reactor operating in a nominal $TM_{011}$ mode. A plasma was established on the structure at a pressure of 180 torr. A polycrystalline CVD diamond film of 35 micron thickness was established on the spherical surface of each silicon mandrel and to a distance of approximately 1 mm down the outer cylindrical section of the silicon mandrel. After laser scoring of the skirt region of the diamond coating, the silicon mandrel was digested in a solution of $HF/HNO_3$ to release a free-standing CVD diamond shell structure having properties suited for use as a diaphragm or dome.

One dome was mounted by epoxy using the cylindrical skirt region to a metal cylinder which was evacuated to low pressure, demonstrating the utility of the dome as a static pressure window.

Another dome was mounted on a voice coil and verified to have an acoustic break-up frequency in excess of 70 kHz, indicative of a rigid, high quality diamond structure.

While this invention has been particularly shown and described with reference to preferred embodiments, it will be understood to those skilled in the art that various changes in form and detail may be made without departing from the scope of the invention as defined by the appendant claims.

The invention claimed is:

1. A method of coating a plurality of non-planar substrate with synthetic diamond material using a microwave plasma chemical vapour deposition (CVD) synthesis technique, the method comprising:
    forming a composite substrate assembly comprising:
        a support substrate comprising an upper surface;
        a plurality of electrically conductive refractory guards disposed over the upper surface of the support substrate and extending to a height $h_g$ above the upper surface of the support substrate; and
        a plurality of non-planar substrates disposed over the upper surface of the support substrate and extending to a height $h_s$ above the upper surface of the support substrate, wherein the height $h_s$ is less than the height $h_g$, wherein a difference in height $h_g-h_s$ lies in a range 0.2 mm to 10 mm;
    placing the composite substrate assembly within a plasma chamber of a microwave plasma CVD reactor;
    feeding process gases into the plasma chamber including a carbon containing gas and a hydrogen containing gas;
    feeding microwaves in the plasma chamber to form a microwave plasma at a location over the composite substrate assembly, wherein the electrically conductive refractory guards are configured to provide a defined focal point for the microwave electric field such that the microwave plasma of suitable intensity is sustained in a stable manner above the plurality of non-planar substrates; and
    growing synthetic diamond material on the plurality of non-planar substrates,
    wherein each of the non-planar substrates comprises a convex dome with an integrally formed peripheral skirt, wherein the peripheral skirt is substantially cylindrical and extends downward from an edge of the convex dome and the synthetic diamond material is disposed over the entire surface of the convex dome and extends down at least a portion of the peripheral skirt, and
    wherein the plurality of non-planar substrates are removed from the synthetic diamond material after growth to yield plurality of free-standing non-planar polycrystalline CVD synthetic diamond components.

2. A method according to claim 1, wherein the difference in height $h_g-h_s$ is less than 5 mm.

3. A method according to claim 1, wherein the difference in height $h_g-h_s$ is more than 1 mm.

4. A method according to claim 1, wherein the difference in height $h_g-h_s$ lies in a range 1 mm to 5 mm.

5. A method according to claim 1, wherein the one or more electrically conductive refractory guards are in the form of continuous or discontinuous rings.

6. A method according to claim 1, wherein the plurality of electrically conductive refractory guards are formed of tantalum, molybdenum, tungsten, or graphite.

7. A method according to claim 1, wherein the plurality of electrically conductive refractory guards are configured to be rotationally symmetric and centred on a central rotational axis of the plasma chamber.

8. A method according to claim 1, wherein the composite substrate assembly is configured to be rotationally symmetric and centred on a central rotational axis of the plasma chamber.

9. A method according to claim 1, wherein the composite substrate comprises two electrically conductive refractory guards configured concentrically defining an annular region therebetween, and wherein a plurality of non-planar substrates are located in the annular region between the two electrically conductive refractory guards.

10. A method according to claim 1, wherein the composite substrate comprises three electrically conductive refractory guards configured concentrically defining inner and outer annular regions therebetween, and wherein a plurality of non-planar substrates are located in the inner and outer annular regions between the three electrically conductive refractory guards.

11. A method according to claim 1, wherein the plurality of non-planar substrates are formed of a non-metallic material.

* * * * *